(12) United States Patent
Kamata

(10) Patent No.: US 8,004,284 B2
(45) Date of Patent: Aug. 23, 2011

(54) LEAK DETECTING CIRCUIT

(75) Inventor: Seiji Kamata, Shioya (JP)

(73) Assignee: Keihin Corporation, Tokyo (JP)

( * ) Notice: Subject to any disclaimer, the term of this patent is extended or adjusted under 35 U.S.C. 154(b) by 290 days.

(21) Appl. No.: 12/469,116

(22) Filed: May 20, 2009

(65) Prior Publication Data

US 2009/0295401 A1 Dec. 3, 2009

(30) Foreign Application Priority Data

May 27, 2008 (JP) .................... 2008-137645

(51) Int. Cl.
*G01R 31/14* (2006.01)
(52) U.S. Cl. ...................................... 324/509
(58) Field of Classification Search .......... None
See application file for complete search history.

(56) References Cited

U.S. PATENT DOCUMENTS

| | | | | |
|---|---|---|---|---|
| 4,768,371 | A * | 9/1988 | Joshi | 73/40.7 |
| 5,412,315 | A * | 5/1995 | Tsuda | 324/750.3 |
| 6,320,389 | B1 * | 11/2001 | Tamesue et al. | 324/509 |
| 6,833,708 | B2 * | 12/2004 | Furukawa | 324/426 |
| 7,375,936 | B2 * | 5/2008 | Morishita | 361/42 |
| 2009/0287430 | A1 * | 11/2009 | Atoji et al. | 702/58 |
| 2009/0295401 | A1 * | 12/2009 | Kamata | 324/509 |
| 2011/0006777 | A1 * | 1/2011 | Park et al. | 324/509 |

FOREIGN PATENT DOCUMENTS

JP 2007-256114 A 10/2007

* cited by examiner

*Primary Examiner* — Jermele M Hollington
(74) *Attorney, Agent, or Firm* — Westerman, Hattori, Daniels & Adrian, LLP

(57) ABSTRACT

A leak detecting circuit includes: a current path having one end connected to a conductor housing a device supplied with a direct-current voltage from a direct-current power source, and having another end connected to a negative electrode of the direct-current power source; the current path including a limiting resistance for limiting a current, a switch element having a first electrode, a second electrode, and a control electrode, conduction between the first electrode and the second electrode being controlled, a detecting resistance for detecting a current flowing through the current path, and a variable direct-current power source allowing a plurality of leak detecting reference voltages for detecting a leak to be selected, and having a negative electrode connected to the negative electrode of the direct-current power source; an amplifier for amplifying a voltage across the detecting resistance; and a constant-voltage circuit for making constant a potential difference between a voltage of the control electrode of the switch element and a voltage of a positive electrode of the variable direct-current power source; wherein a leak between the conductor and the direct-current power source is detected on a basis of the voltage across the detecting resistance, the voltage across the detecting resistance being amplified by the amplifier.

4 Claims, 11 Drawing Sheets

LEAK DETECTING CIRCUIT

BACKGROUND OF THE INVENTION

1. Field of the Invention

The present invention relates to a leak detecting circuit for detecting a leak between the body of a vehicle including a device supplied with a direct-current voltage by a direct-current high-voltage power source and the direct-current high-voltage power source.

2. Description of the Related Art

A direct-current high-voltage power source (hereinafter a high-voltage battery) included in an electrically driven vehicle such as an electric car, a hybrid vehicle, or a fuel cell vehicle is usually not connected to a ground because when the negative electrode, the positive electrode or the like of the high-voltage battery is grounded, contact of a person engaged in service or the like with the high-voltage battery or a failure of the high-voltage battery may lead to an electric shock or a serious damage, and are thus dangerous. When a leak (ground fault) occurs between the high-voltage battery and the body of the vehicle as a result of external contamination such as mixing in of foreign matter, or water drop intrusion between the positive electrode or the negative electrode of the high-voltage battery and the body of the vehicle, because the leak is dangerous, the leak is detected, and an abnormality lamp is lit, for example, to warn a person engaged in service.

Related art relating to leak detection includes Patent Document 1. In Patent Document 1 (Japanese Patent Laid-Open No. 2007-256114), a protective resistance 10, an FET 20, a detecting resistance 30, and a variable direct-current power source 40 are connected in series with each other between a body ground and the negative electrode of a high-voltage battery, and a fixed voltage is applied to the gate of the FET 20 with the negative electrode of the high-voltage battery as a reference, to turn on the FET 20. In the case of a high potential side leak, in which a leak occurs between the positive electrode of the high-voltage battery and the body ground, a leak current flowing from the positive electrode of the high-voltage battery to a high potential side leak resistance to the body ground to the protective resistance 10 to the FET 20 to the detecting resistance 30 to the variable direct-current power source 40 to the negative electrode of the high-voltage battery is detected by a voltage across the detecting resistance 30, and the high potential side leak is detected.

At this time, because of insusceptibility to change in voltage of the high-voltage battery, the reference voltage for leak detection (reference voltage) of the variable direct-current power source 40 is changed to two voltages, for example 0V and 10-odd V, the leak current is calculated from voltages across the detecting resistance 30 at the two different reference voltages, the high potential side leak resistance is calculated from a current difference of the leak current or a voltage difference between the voltages across the detecting resistance 30, and the high potential side leak is determined.

However, Patent Document 1 has the following problems because a fixed gate voltage is applied to the FET 20, the voltage across the detecting resistance 30 is detected while the voltage (reference voltage) of the variable direct-current power source 40 is changed, and a leak, for example a high potential side leak is detected.

A minute leakage current (on the order of a few μA, for example) proportional to a voltage between the gate and the source of the FET 20 due to a resistance between the gate and the source of the FET 20 flows from the gate to the source of the FET 20. This leakage current flows into the detecting resistance 30 from the source of the FET 20. Therefore, the leakage current flows through the detecting resistance 30 in addition to the leak current. The leak current is limited by the protective resistance 10 to become a minute current (on the order of a few μA, for example) for protection from a hazard.

Because a fixed gate voltage is applied to the gate, when the reference voltage of the variable direct-current power source 40 is changed (changed from 0 V to 10-odd V, for example), the source voltage is changed by 10-odd V with the change in reference voltage of the variable direct-current power source 40. However, because the gate voltage is fixed, the voltage between the gate and the source is changed by 10-odd V, so that the leakage current proportional to the voltage between the gate and the source varies greatly.

The voltages across the detecting resistance 30 which voltages are detected under different reference voltages of the variable direct-current power source 40 each include a different error due to a different leakage current. Therefore, the error of the leakage current cannot be cancelled by a current difference or a voltage difference, and a detection error due to the difference in leakage current is included. Because of the minute leak detection current, the detection error due to the difference in leakage current cannot be ignored, and leak detection accuracy is degraded.

SUMMARY OF THE INVENTION

The present invention has been made in view of the above problems, and it is an object of the present invention to provide a leak detecting circuit that can make constant a voltage between the positive electrode of a variable direct-current power source and the control electrode of a switch, make a leakage current substantially constant, and thereby prevent degradation in leak detection accuracy due to the leakage current even when the voltage of the variable direct-current power source is changed at a time of leak detection.

In accordance with an aspect of the first present invention, there is provided a leak detecting circuit including: a current path having one end connected to a conductor housing a device supplied with a direct-current voltage from a direct-current power source, and having another end connected to a negative electrode of the direct-current power source; the current path including a limiting resistance for limiting a current, a switch element having a first electrode, a second electrode, and a control electrode, conduction between the first electrode and the second electrode being controlled, a detecting resistance for detecting a current flowing through the current path, and a variable direct-current power source allowing a plurality of leak detecting reference voltages for detecting a leak to be selected, and having a negative electrode connected to the negative electrode of the direct-current power source; an amplifier for amplifying a voltage across the detecting resistance; and a constant-voltage circuit for making constant a potential difference between a voltage of the control electrode of the switch element and a voltage of a positive electrode of the variable direct-current power source; wherein a leak between the conductor and the direct-current power source is detected on a basis of the voltage across the detecting resistance, the voltage across the detecting resistance being amplified by the amplifier.

Because the constant-voltage circuit for making constant the voltage difference between the voltage of the control electrode of the switch element and the voltage of the positive electrode of the variable direct-current power source is provided, the voltage between the control electrode and the positive electrode of the variable direct-current power source can be made constant even when a reference voltage for leak detection (hereinafter a reference voltage) is changed. Thus, when variation in the voltage across the detecting resistance due to change in the leak current is small as compared with the voltage between the control electrode and the positive electrode of the variable direct-current power source, a voltage between the control electrode and the second electrode is substantially constant, and a current between the control electrode and the second electrode can be made substantially constant, so that degradation in leak detection accuracy can be prevented.

According to a second present invention, there is provided a leak detecting circuit wherein the switch element is a field-effect transistor. It is possible to provide a leak detecting circuit that can make a voltage between the gate and the source of the field-effect transistor substantially constant and make a leakage current proportional to the voltage between the gate and the source substantially constant even when the reference voltage is changed, so that the accuracy of leak detection using the field-effect transistor is not degraded.

According to a third present invention, there is provided a leak detecting circuit wherein when a high potential side leak between a positive electrode of the direct-current power source and the conductor is detected, a control signal is output to the variable direct-current power source so that a first leak detecting reference voltage and a second leak detecting reference voltage are output from the variable direct-current power source, the high potential side leak resistance is calculated on a basis of a difference between a first detected voltage across the detecting resistance at the first leak detecting reference voltage and a second detected voltage across the detecting resistance at the second leak detecting reference voltage, and the high potential side leak is detected.

Because the high potential side leak resistance between the positive electrode of the direct-current power source and the conductor is calculated on the basis of the difference between the first detected voltage across the detecting resistance at the first reference voltage and the second detected voltage across the detecting resistance at the second reference voltage, a current flowing from the control electrode to the second electrode can be cancelled, and thus leak detection accuracy is not degraded.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENT

Figure 1:
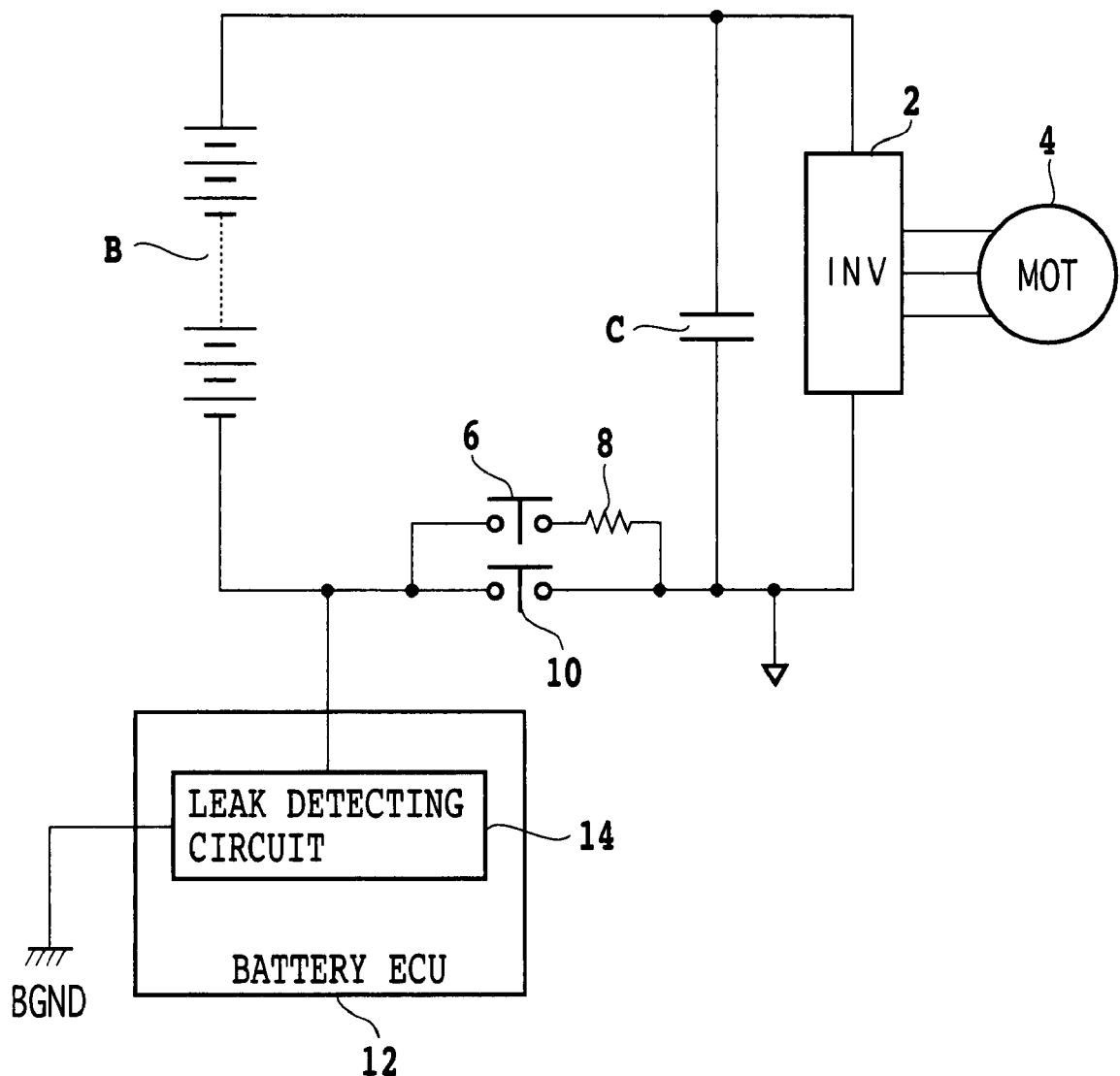
FIG. 1 is a schematic configuration diagram of a hybrid vehicle according to an embodiment of the present invention.

FIG. 1 is a schematic configuration diagram of an electrically driven vehicle such as a hybrid vehicle, an electric car, or a fuel cell vehicle including a high-voltage battery according to an embodiment of the present invention, for example a hybrid vehicle. The hybrid vehicle includes a high-voltage battery B, a smoothing capacitor C, an inverter 2, a motor 4, a precharge contactor 6, a precharge resistance 8, a main contactor 10, and a battery ECU 12 as shown in FIG. 1, and sensors such as a battery current sensor or a thermistor, a fuse, and a breaker that are not shown in the figure.

The high-voltage battery (direct-current power source) B is a storage device for supplying power to the motor 4 via the inverter 2, and is a lithium-ion battery, a nickel-hydrogen battery or the like. The high-voltage battery B is formed by a series connection of a plurality of battery blocks having a plurality of cells modularized therein. The high-voltage battery B is electrically insulated from a body (hereinafter a body ground) BGND housing the vehicle including a device such as the inverter 2 supplied with a high direct-current voltage.

The smoothing capacitor C is a capacitor for smoothing an output from the high-voltage battery B and the inverter 2. The inverter 2 at a time of driving of the motor 4 (assistance by the motor 4) converts a voltage from the high-voltage battery B into a three-phase alternating voltage by PWM control that turns on/off a switching element not shown in the figure by a motor ECU not shown in the figure, and outputs the three-phase alternating voltage to the motor 4. In addition, the inverter 2 converts a three-phase alternating voltage generated by the motor 4 into a direct-current voltage under control of the motor ECU.

The motor 4 has an output shaft connected to a crankshaft of an engine not shown in the figure. A three-phase brushless motor, for example, is used as the motor 4. At a time of driving, the motor 4 is supplied with alternating-current power, for example three-phase alternating-current power by the inverter 2 to operate as an electric motor. The electric motor is driven to start the engine or assist in driving force of the engine. At a time of regeneration, alternating-current power generated by the motor 4 is converted by the inverter 2 into direct-current power to charge the high-voltage battery B.

The precharge contactor 6 and the precharge resistance 8 precharges the smoothing capacitor C to prevent melting of the main contactor 10, protect the cells of the high-voltage battery B, and prevent damage to the smoothing capacitor C due to rush current when an ignition switch is turned on.

The main contactor 10 is a relay that performs or interrupts supply of power from the high-voltage battery B to the inverter 2 and supply of power from the inverter 2 to the high-voltage battery B. The main contactor 10 has one contact connected to the negative electrode of the high-voltage battery B, and has another contact connected to the negative electrode of the smoothing capacitor C.

The battery ECU 12 includes a leak detecting circuit 14. The battery ECU 12 detects a leak between the high-voltage battery B and the body ground BGND, controls the main contactor 10 and the precharge contactor 6, and monitors and controls the high-voltage battery B on the basis of output of the thermistor, the battery current sensor and the like not shown in the figure. The sensors such as the battery current sensor or the thermistor not shown in the figure are sensors for monitoring and controlling the high-voltage battery B. The fuse is for overcurrent protection. The breaker is to ensure safety of work.

Figure 2:
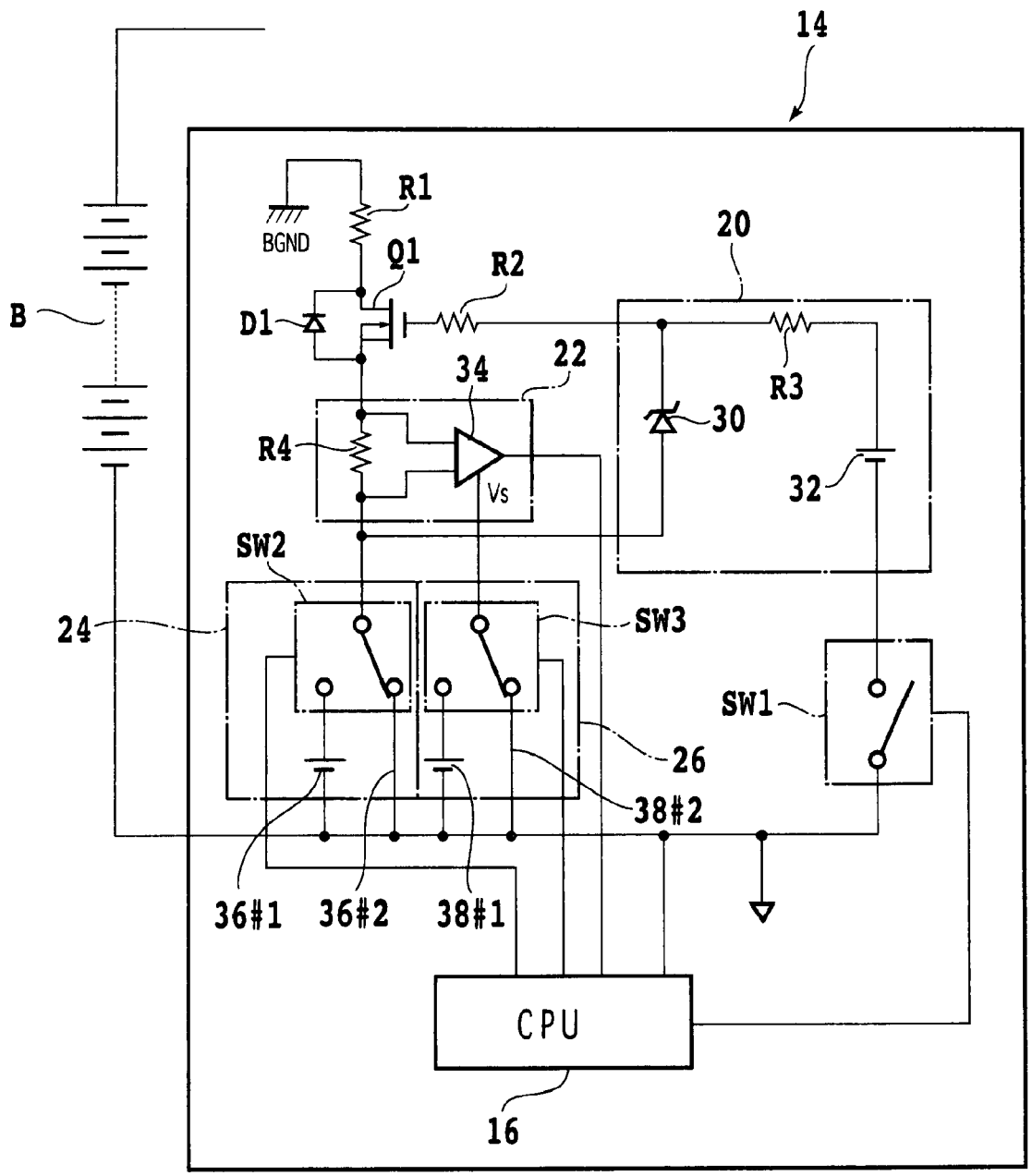
FIG. 2 is a configuration diagram of a leak detecting circuit according to an embodiment of the present invention.

FIG. 2 is a circuit diagram of the leak detecting circuit 14 in FIG. 1 according to an embodiment of the present invention. As shown in FIG. 2, the leak detecting circuit 14 has a limiting resistance R1, an FET Q1, a diode D1, a constant-voltage circuit 20, a voltage detecting section 22, a variable direct-current power source 24, an offset changing section 26, a switch SW1, and a CPU 16. The leak detecting circuit 14 has one terminal connected to the body ground BGND, and has another terminal connected to the negative electrode of the high-voltage battery B. The leak detecting circuit 14 includes a current path formed by connecting the limiting resistance R1, the FET Q1, a detecting resistance R4 in the voltage detecting section 22, and the variable direct-current power source 24 in series with each other.

The limiting resistance (protective resistance) R1 is a current limiting resistance for preventing an excessive current from flowing through the current path, and thus protecting the current path from a hazard. The limiting resistance R1 has one terminal connected to the body ground BGND, and has another terminal connected to the drain electrode (first electrode) of the FET Q1.

The FET Q1 is a switching element that controls conduction between the first electrode (drain) and a second electrode (source) on the basis of a first control signal applied to a control electrode (gate) to turn on/off a leak detection. The FET Q1 is, for example, an n-channel field-effect transistor. The drain is connected to the other terminal of the limiting resistance R1. The source is connected to one terminal of the detecting resistance R4 and an amplifier 34 of the voltage detecting section 22. The gate is connected to one terminal of a resistance R2. The resistance R2 is a resistance for suppressing a leakage current. The resistance R2 has one terminal connected to the gate of the FET Q1, and has another terminal connected to the constant-voltage circuit 20.

The diode D1 is a body diode connected so as to be anti-parallel with the FET Q1. The diode D1 has an anode connected to one terminal of the detecting resistance R4 and the source of the FET Q1, and has a cathode connected to the other terminal of the limiting resistance R1 and the drain of the FET Q1. In a case of a low potential side leak, in which a leak occurs between the negative electrode of the high-voltage battery B and the body ground BGND, the diode D1 is forward-biased and turned on, and the FET Q1 is turned on.

The constant-voltage circuit 20 is controlled to be in an operating state/non-operating state by the switch SW1, which is turned on/off under control of the CPU 16. In an operating state, the constant-voltage circuit 20 forms a constant-voltage circuit that makes constant a voltage difference between the voltage of the positive electrode of the variable direct-current power source 24 and the voltage of the gate of the FET Q1, and outputs the first control signal that turns on the FET Q1 to the gate. In a non-operating state, the constant-voltage circuit 20 outputs the first control signal that turns off the FET Q1 to the gate. The constant-voltage circuit 20 has a Zener diode 30, a direct-current power source 32, and a resistance R3. The resistance R3 has one terminal connected to the other terminal of the resistance R2 and the cathode of the Zener diode 30, and has another terminal connected to the positive electrode of the direct-current power source 32.

The Zener diode 30 clamps a voltage between the anode and the cathode thereof to a voltage V1 when the voltage between the anode and the cathode exceeds the breakdown voltage V1 (for example, 15 V). The anode is connected to the other terminal of the detecting resistance R4, the amplifier 34, and the positive electrode of the variable direct-current power source 24. The cathode is connected to one terminal of the resistance R3 and the other terminal of the resistance R2.

The direct-current power source 32 is a direct-current power source that outputs a voltage V2 exceeding the breakdown voltage V1 of the Zener diode 30 (for example, a 20-odd-V power source). The direct-current power source 32 has a positive electrode connected to the other terminal of the resistance R3, and has a negative electrode connected to the negative electrode of the high-voltage battery B via the switch SW1. The voltage V2 of the direct-current power source 32 is set according to the breakdown voltage V1 and the reference voltage Vref of the variable direct-current power source 24 which reference voltage is changed at a time of detecting a high potential side leak current.

When the switch SW1 is on, and a switch SW2 is changed to the reference voltage Vref of a power source 36#i (i=1, 2) of the variable direct-current power source 24, the direct-current power source 32 and the power source 36#i (i=1, 2) are connected to the negative electrode of the high-voltage battery B, and thus a voltage (V2−Vref) is applied to the Zener diode 30.

When (V2−Vref)≧V1, a current flows from the positive electrode of the direct-current power source 32 to the resistance R3 to the Zener diode 30 to the power source 36#i to the negative electrode of the high-voltage battery B, the Zener diode 30 is clamped to the voltage V1, and thus a voltage between the positive electrode of the variable direct-current power source 24 and the gate of the FET Q1 is constant at V1. Because of small voltage variation (for example, a few hundred mV) due to variation in leak current across the detecting resistance R4 as a result of changing the reference voltage as compared with the voltage between the positive electrode of the variable direct-current power source 24 and the gate, a voltage Vgs between the gate and the source of the FET Q1 is substantially constant.

When (V2−Vref)<V1, the voltage between the positive electrode of the variable direct-current power source 24 and the gate of the FET Q1 is V1. Hence, when the reference voltage Vref of the variable direct-current power source 24 is in (V2−Vref)>V1, or (V2−Vref) is close to V1, the voltage between the positive electrode of the variable direct-current power source 24 and the gate of the FET Q1 is constant at substantially V1, and the voltage Vgs between the gate and the source of the FET Q1 is substantially constant.

For example, when V1=15 V, V2=25 V, and Vref is in a range of 0 to about 10 V, the voltage between the positive electrode of the variable direct-current power source 24 and the gate of the FET Q1 is substantially constant at about 15 V, and the voltage Vgs between the gate and the source of the FET Q1 is substantially constant. When the reference voltage Vref of the variable direct-current power source 24 is made variable in a range where the voltage Vgs between the gate and the source of the FET Q1 is constant, the leakage current is constant. Thus, when the voltage across the detecting resistance R4 is detected under different reference voltages by changing the reference voltage Vref of the variable direct-current power source 24 in order to perform measurement unaffected by change in voltage of the high-voltage battery B as in the case of a high potential side leak detection, as will be described later, the leakage current is substantially constant, and therefore an error in the leakage current can be cancelled by a difference between voltages across the detecting resistance R4 or a difference between leak currents under the different reference voltages. Thus, detection accuracy is not affected by the leakage current.

The switch SW1 is disposed between the negative electrode of the direct-current power source 32 and the negative electrode of the high-voltage battery B. The switch SW1 is controlled to be turned on/off by the CPU 16 so that the operation/non-operation of the constant-voltage circuit 20 is controlled.

The voltage detecting section 22 has the detecting resistance R4 and the amplifier 34. The voltage across the detecting resistance R4 is detected to calculate a leak current and a leak resistance. The detecting resistance R4 has one terminal connected to the source of the FET Q1 and the amplifier 34, and has another terminal connected to the positive electrode of the variable direct-current power source 24 and the amplifier 34.

The amplifier 34 is an operational amplifier that has an offset changing terminal, amplifies the voltage across the detecting resistance R4 with a certain gain, for example a gain=1, and shifts the amplified voltage by an offset voltage Vs output from the offset changing section 26 to the offset changing terminal. The amplifier 34 is connected across the detecting resistance R4.

The directions of leak currents in the case of a high potential side leak and the case of a low potential side leak are opposite from each other, and voltages across the detecting resistance R4 in the case of a high potential side leak and the case of a low potential side leak are also in opposite directions. Thus, a level shift by the offset voltage Vs enables effective use of a dynamic range and an improvement in detection accuracy. For example, in the case of a high potential side leak, the voltage across the detecting resistance R4 is positive, and thus the offset voltage Vs is set at zero. In the case of a low potential side leak, the voltage across the detecting resistance R4 is negative, and is thus shifted by the offset voltage Vs (>0) to become a positive value.

The variable direct-current power source 24 outputs the reference voltage Vref on the basis of a control signal from the CPU 16. The variable direct-current power source 24, for example, includes a plurality of power sources 36#1 and 36#2 and a switch SW2. The power sources 36#1 and 36#2 have a positive electrode connected to the switch SW2, and have a negative electrode connected to the negative electrode of the high-voltage battery B. The power sources 36#1 and 36#2 are, for example, direct-current power sources of about 10 V and 0 V. For example, when the reference voltage Vref is about 10 V or 0 V, V1=15 V, and V2=25 V, the voltage between the positive electrode of the variable direct-current power source 24 and the gate is a constant voltage of about 15 V.

The switch SW2 is disposed between the positive electrode side of the plurality of power sources 36#1 and 36#2 and the other terminal of the detecting resistance R4. The switch SW2 connects one of the positive electrodes of the plurality of power sources 36#1 and 36#2 to the other terminal of the detecting resistance R4 on the basis of a control signal from the CPU 16.

The offset changing section 26 outputs the offset voltage Vs to the amplifier 34 on the basis of a control signal from the CPU 16. The offset changing section 26 includes, for example, a plurality of power sources 38#1 and 38#2 and a switch SW3. Suppose that the voltages of the power sources 38#1 and 38#2 are positive and zero. The switch SW3 is disposed between the positive electrode side of the plurality of power sources 38#1 and 38#2 and the offset terminal of the amplifier 34. The switch SW3 connects one of the plurality of power sources 38#1 and 38#2 to the offset terminal on the basis of a control signal from the CPU 16.

The CPU 16 is a processor that operates with the voltage of the negative electrode of the high-voltage battery B as a ground. As will be described later, the CPU 16 controls the switches SW1, SW2, and SW3, detects a high potential side leak resistance between the positive electrode of the high-voltage battery B and the body ground BGND and a low potential side leak resistance between the negative electrode of the high-voltage battery B and the body ground BGND on the basis of the voltage of a digital signal resulting from A/D conversion from an output of the amplifier 34 by an A/D converter not shown in the figure, and then detects a high potential side leak and a low potential side leak.

Figure 3:
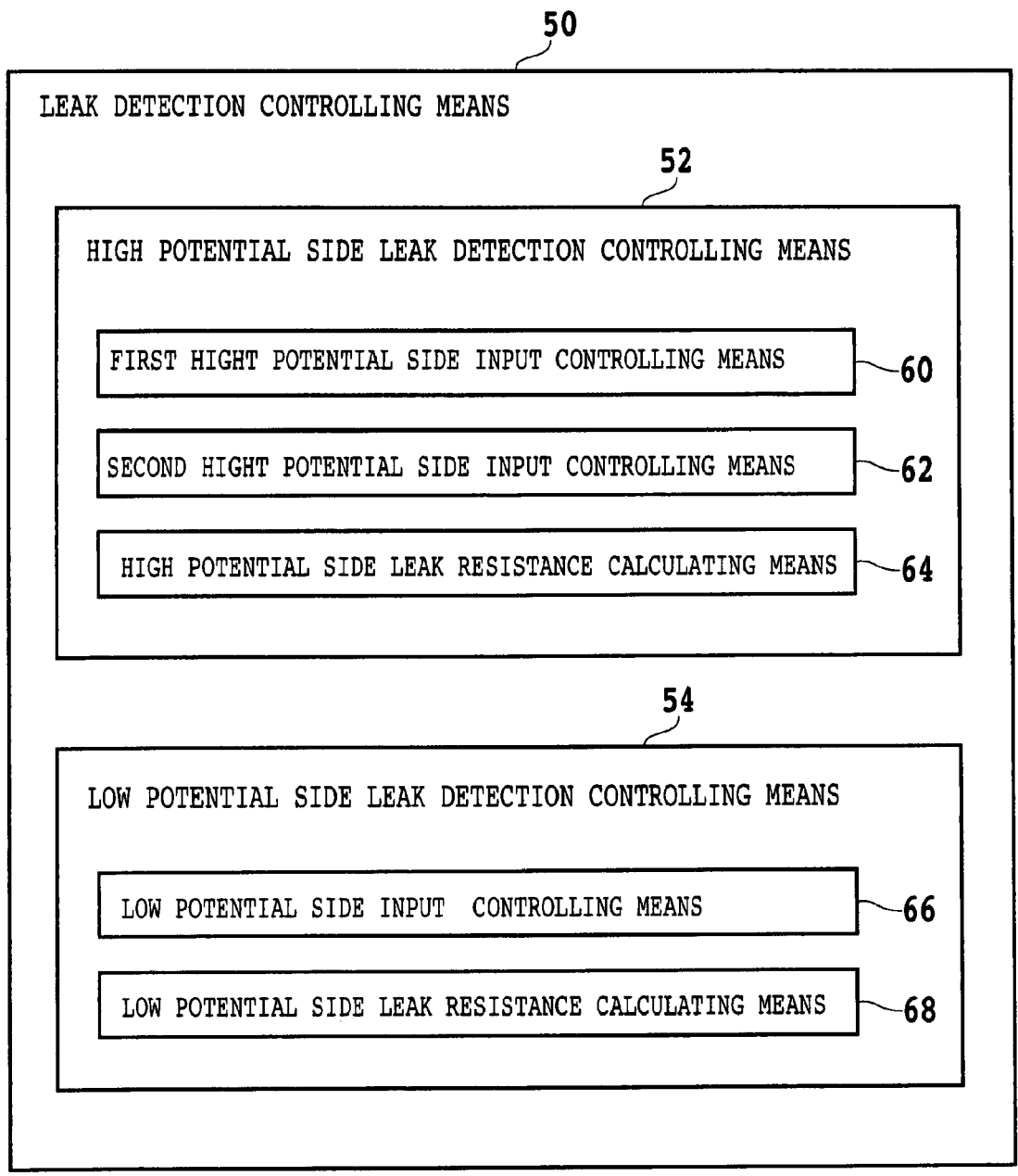
FIG. 3 is a functional block diagram relating to leak detection.

FIG. 3 is a block diagram of leak detection controlling means 50 relating to leak detection of the CPU 16. As shown in FIG. 3, the leak detection controlling means 50 has high potential side leak detection controlling means 52 and low potential side leak detection controlling means 54. The high potential side leak detection controlling means 52 has first high potential side input controlling means 60, second high potential side input controlling means 62, and high potential side leak resistance calculating means 64. The low potential side leak detection controlling means 54 has low potential side input controlling means 66 and low potential side leak resistance calculating means 68. In leak detection, for example six periods, which are a non-measurement period, a first high potential side leak detection period, a non-measurement period, a second high potential side leak detection period, a non-measurement period, and a low potential side leak detection period, are sequentially repeated.

The first high potential side input controlling means 60 in the first high potential side leak detection period controls the switch SW1 so as to be turned on, controls the switch SW2 such that a first high potential side reference voltage Vref1 is about 10 V, and controls the switch SW3 such that the offset voltage Vs=0. The first high potential side input controlling means 60 then obtains a voltage Vin1 output from the amplifier 34 and subjected to A/D conversion in a period in which the switching of the FET Q1 is stabilized. At a rising edge or a falling edge of the FET Q1, a gate current flows through a parasitic capacitance between the gate and the source due to the switching, and a leakage current and a drain current are unstable. Therefore the voltage Vin1 is obtained in the stable period.

The second high potential side input controlling means 62 in the second high potential side leak detection period controls the switch SW1 so as to be turned on, controls the switch SW2 such that a second high potential side reference voltage Vref2 is about 0 V, and controls the switch SW3 such that the offset voltage Vs=0. The second high potential side input controlling means 62 then obtains a voltage Vin2 output from the amplifier 34 and subjected to A/D conversion in a period in which the switching of the FET Q1 is stabilized.

Figure 4A:
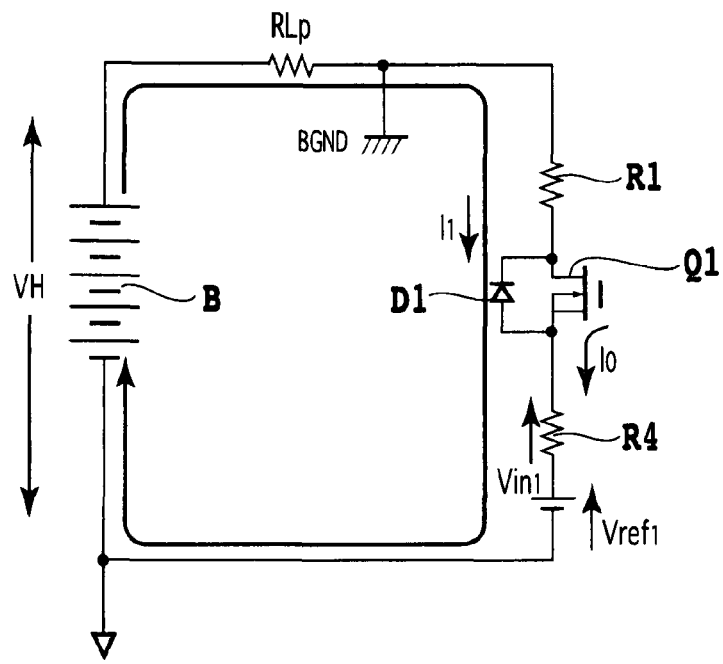
FIG. 4A is a diagram for calculating a high potential side leak resistance.
Figure 4B:
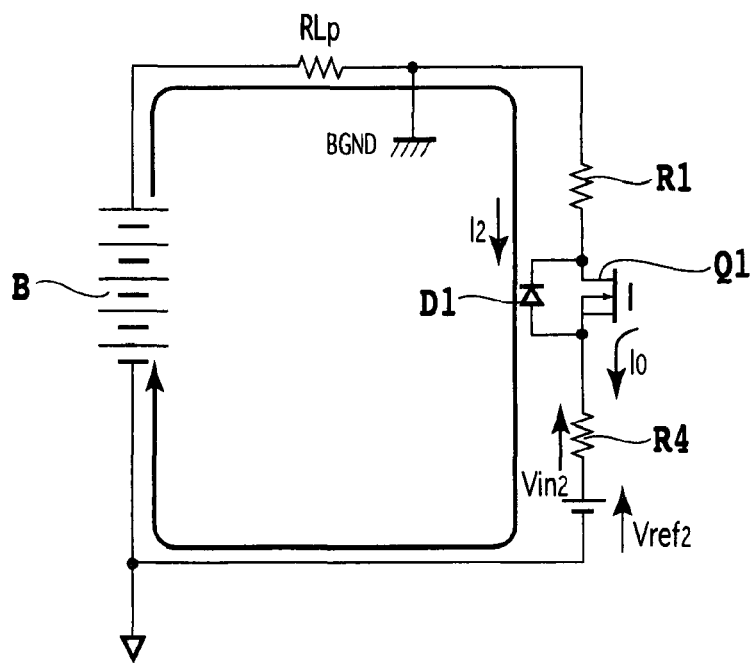
FIG. 4B is a diagram for calculating a high potential side leak resistance.

FIGS. 4A and 4B are diagrams representing principles for calculating a high potential side leak resistance. FIG. 4A is an equivalent circuit diagram in the first high potential side leak detection period. FIG. 4B is an equivalent circuit diagram in the second high potential side leak detection period. RLp is a high potential side leak (ground fault) resistance, R1 is the resistance value of the limiting resistance R1, and R4 is the resistance value of the detecting resistance R4. Vref1 is the first high potential side reference voltage, and Vref2 is the second high potential side reference voltage.

I1 and I2 are a leak current, and I0 is a leakage current. VH is the voltage of the high-voltage battery B.

The following Equation (1) holds in the first high potential side leak detection period.

$$VH = RLp \times I1 + R1 \times I1 + Vin1 + Vref1 \quad (1)$$

The following Equation (2) holds in the second high potential side leak detection period.

$$VH = RLp \times I2 + R1 \times I2 + Vin2 + Vref2 \quad (2)$$

$$I1 = (Vin1 - Vin0)/R4, I2 = (Vin2 - Vin0)/R4$$

where Vin0 is a voltage across the detecting resistance R4 due to the leakage current I0, and is constant. From Equations (1) and (2), Equation (3) holds.

$$RLp = -R4(Vref1 - Vref2)/(Vin1 - Vin2) - R1 - R4 \quad (3)$$

The high potential side leak resistance calculating means 64 in the second high potential side leak detection period calculates the high potential side leak resistance RLp from Equation (3).

An error voltage of the detecting resistance R4 due to the leakage current included in the voltages Vin1 and Vin2 is cancelled by (Vin1−Vin2) in Equation (3). Thus leak detection accuracy is improved.

The low potential side input controlling means 66 in the low potential side leak detection period controls the switch SW1 so as to be turned on, controls the switch SW2 such that a low potential side reference voltage Vref1 is about 10 V, and controls the switch SW3 such that the offset voltage Vs>0. The low potential side input controlling means 66 then obtains a voltage Vin3 output from the amplifier 34 and subjected to A/D conversion in a period in which the switching of the FET Q1 is stabilized.

Figure 5:
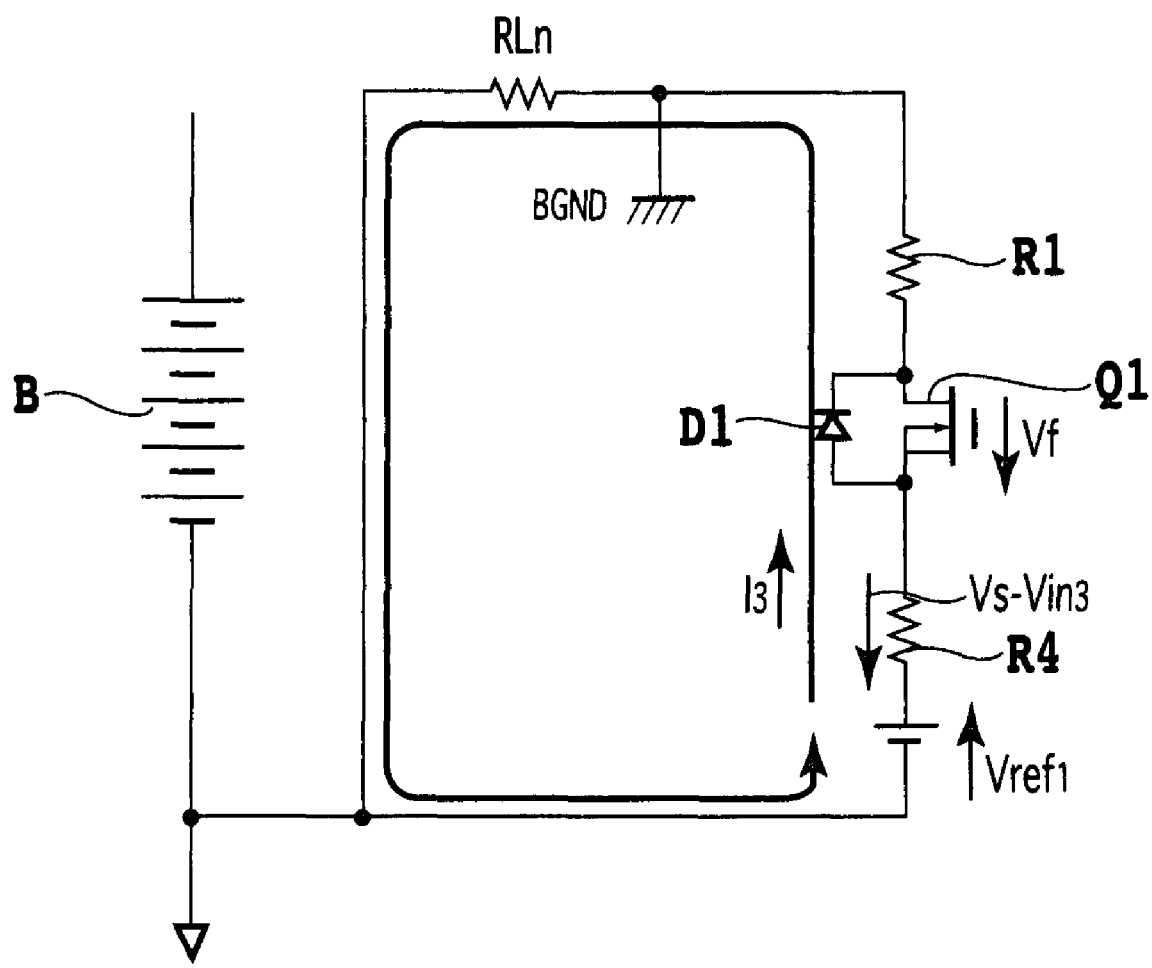
FIG. 5 is a diagram for calculating a low potential side leak resistance.

FIG. 5 is a diagram representing principles for calculating a low potential side leak resistance. RLn is a low potential side leak (ground fault) resistance, R1 is the resistance value of the limiting resistance R1, and R4 is the resistance value of the detecting resistance R4. Incidentally, a diode and a resistance may be provided in parallel with the limiting resistance R1. Vref1 is the low potential side reference voltage. I3 is a leak current.

The following Equation (4) holds in the low potential side leak detection period.

$$Vref1 = RLn \times I3 + R1 \times I3 + (Vs - Vin3) \quad (4)$$

$$I3 = (Vs - Vin3)/R4$$

From Equation (4), Equation (5) holds.

$$RLn = Vref1/(Vs - Vin3) - R1 - R4 \quad (5)$$

Incidentally, when the low potential side leak current is adjusted by providing a resistance sufficiently lower than the limiting resistance R1 in parallel with the limiting resistance R1 and providing a diode in series with the resistance, Vref1 is (Vref1−Vf). The resistance R1 is the resistance value of the parallel resistances. Vf is the forward fall voltage of the diode.

The low potential side leak resistance calculating means 68 in the low potential side leak detection period calculates the low potential side leak resistance RLn from Equation (5).

FIGS. 6 to 9 are flowcharts representing a leak detecting method. FIG. 10 is a time chart representing the leak detecting method. The leak detecting method will be described below according to these drawings. The flowcharts of FIGS. 6 to 9 are repeated in fixed cycles.

Figure 6:
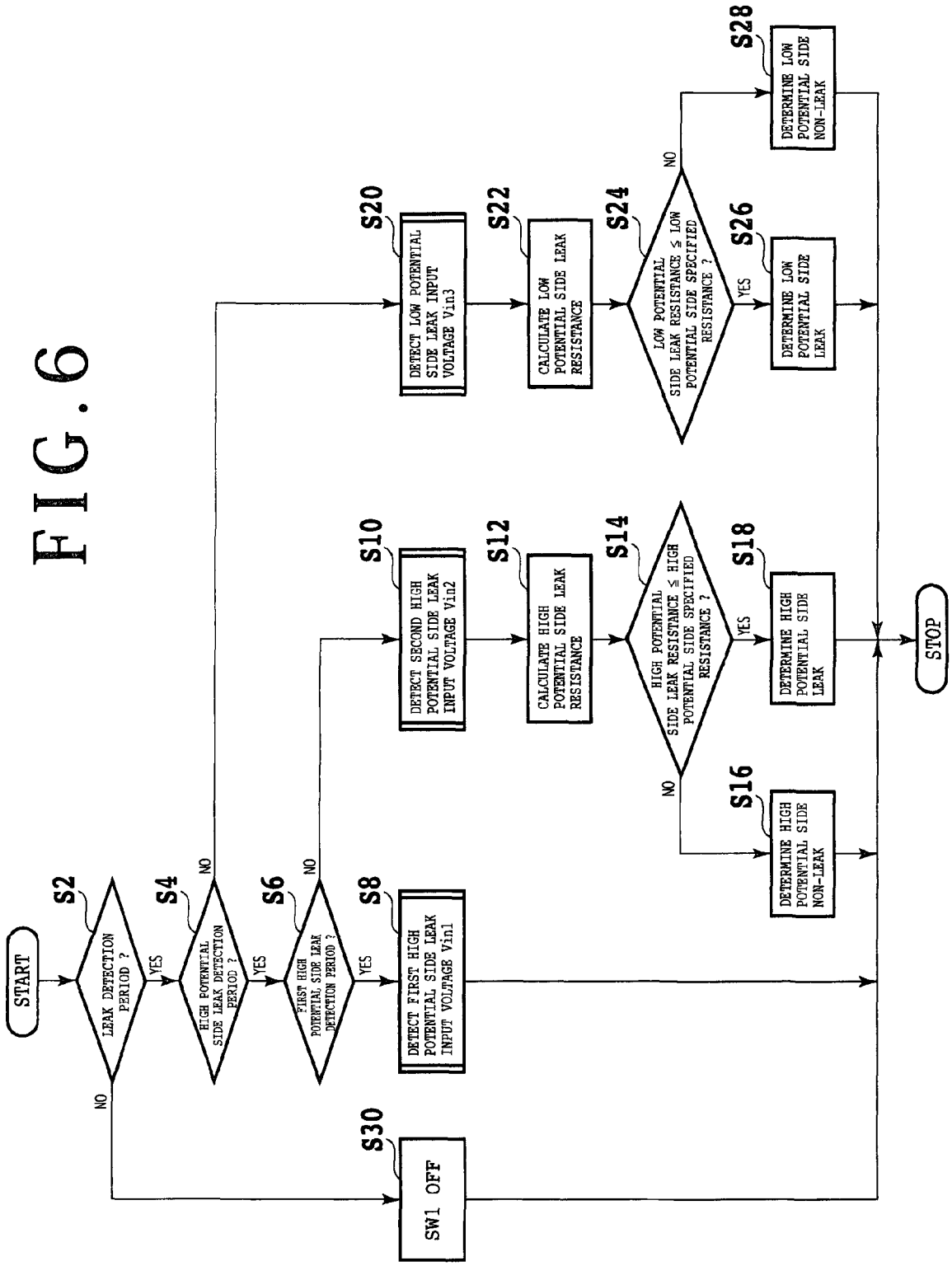
FIG. 6 is a flowchart representing a leak detecting method.

Whether it is a leak detection period or not is determined in step S2 in FIG. 6. When a positive determination is made, the process proceeds to step S4. When a negative determination is made, the process proceeds to step S30, where the switch SW1 is turned off. In periods from time t0 to time t1, from time t2 to time t3, and from time t4 to time t5 in FIG. 10, the switch SW1 is off. Whether it is a high potential side leak detection period or not is determined in step S4. When a positive determination is made, the process proceeds to step S6. When a negative determination is made, the process proceeds to step S20.

Whether it is a first high potential side leak detection period or not is determined in step S6. When a positive determination is made, the process proceeds to step S8. For example, the process proceeds to step S8 at time t1. When a negative determination is made, the process proceeds to step S10. For example, the process proceeds to step S10 at time t3. A flow shown in FIG. 7 is performed in step S8.

Figure 7:
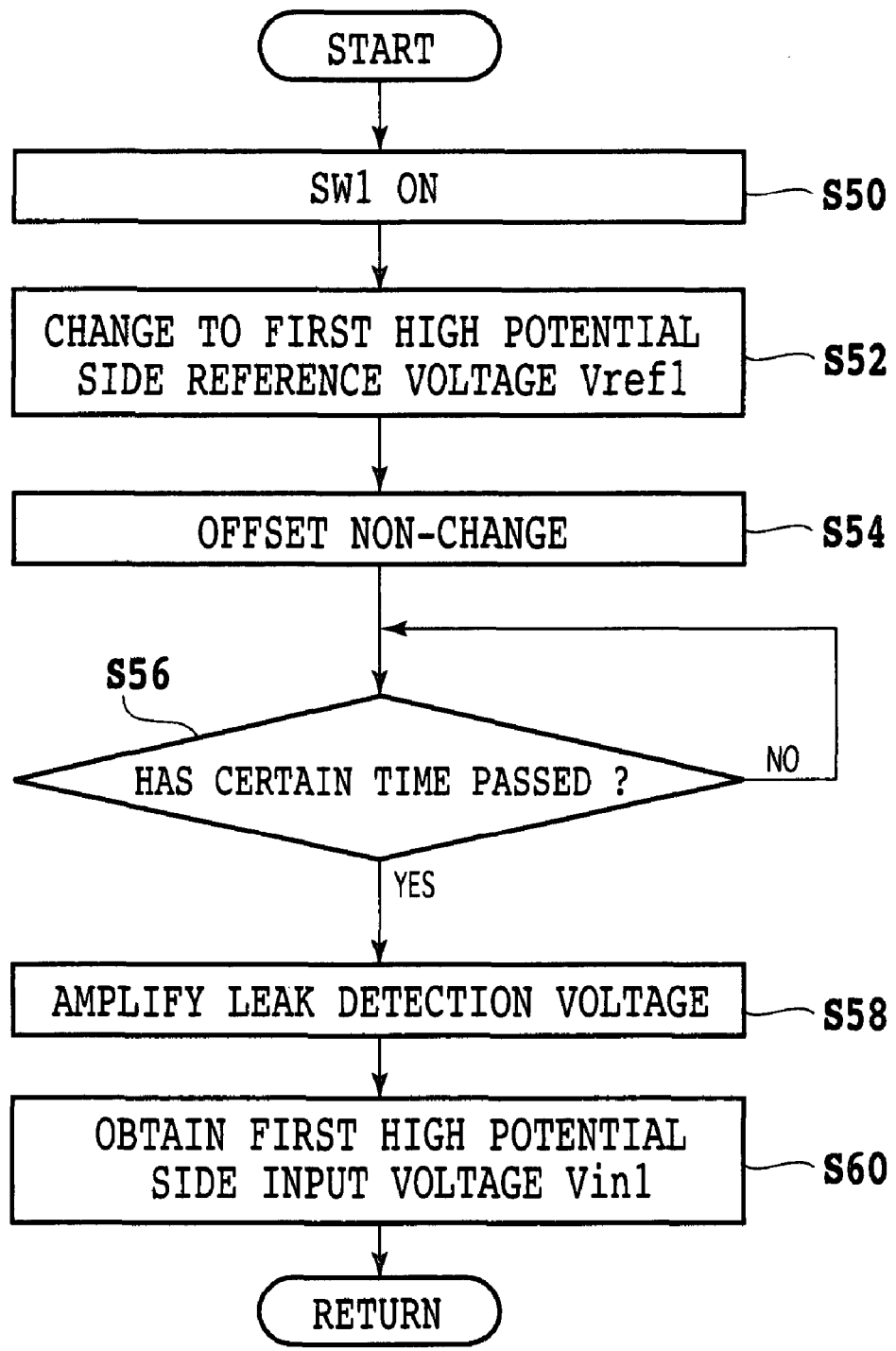
FIG. 7 is a flowchart representing the leak detecting method.

In step S50 in FIG. 7, the switch SW1 is turned on, and the FET Q1 is turned on. In step S52, the switch SW2 in the variable direct-current power source 24 is controlled to be changed to the first high potential side reference voltage Vref1, for example about 10 V. In step S54, the switch SW3 in the offset changing section 26 is controlled to make no offset change (offset voltage Vs=0). Whether a certain time after which the output of the FET Q1 is stabilized has passed or not is determined in step S56. When a positive determination is made, the process proceeds to step S58. When a negative determination is made, the process waits in step S56.

Figure 11A:
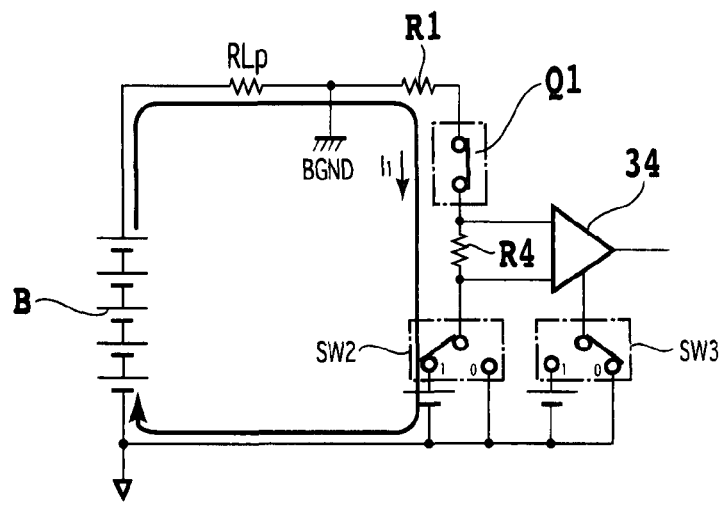
FIG. 11A is a diagram showing a flow of a leak current.

In step S58, a leak detection voltage is amplified by the amplifier 34 with a predetermined gain, for example a gain of one. A first high potential side input voltage Vin1 output from the A/D converter is obtained in step S60, and then the process returns. For example, the first high potential side input voltage Vin1 is obtained in a stable period T1. As shown in FIG. 11A, when a leak occurs on the high potential side, a leak current I1 flows from the positive electrode of the high-voltage battery B to the high potential side leak resistance RLp to the limiting resistance R1 to the FET Q1 to the detecting resistance R4 to the switch SW2 to the power source 36#1 (about 10 V) to the negative electrode of the high-voltage battery B.

Figure 8:
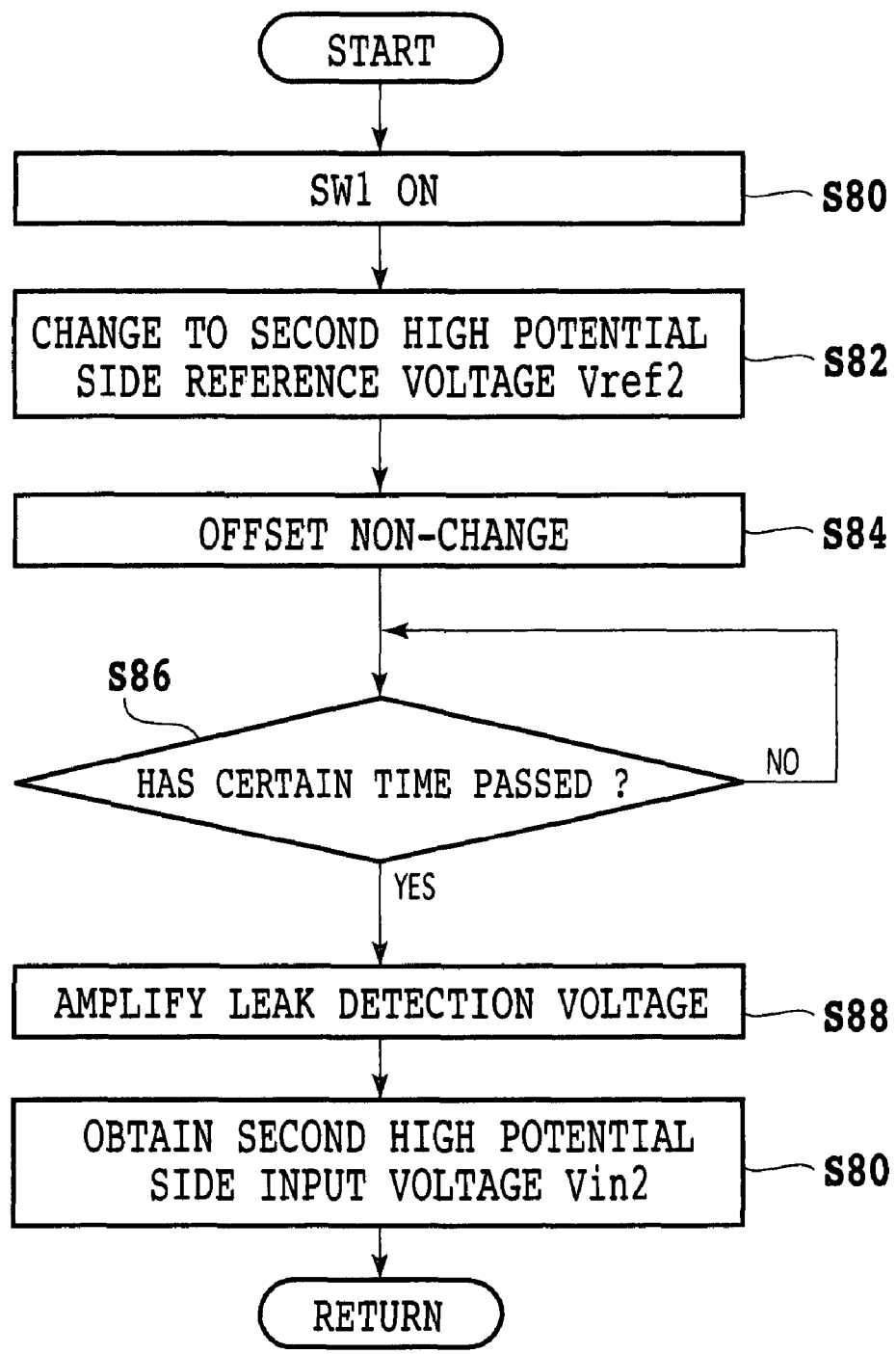
FIG. 8 is a flowchart representing the leak detecting method.

A flow shown in FIG. 8 is performed in step S10. In step S80 in FIG. 8, the switch SW1 is turned on, and the FET Q1 is turned on. In step S82, the switch SW2 in the variable direct-current power source 24 is controlled to be changed to the second high potential side reference voltage Vref2, for example 0 V. In step S84, the switch SW3 in the offset changing section 26 is controlled to make no offset change (offset voltage Vs=0). Whether a certain time after which the output of the FET Q1 is stabilized has passed or not is determined in step S86. When a positive determination is made, the process proceeds to step S88. When a negative determination is made, the process waits in step S86.

Figure 11B:
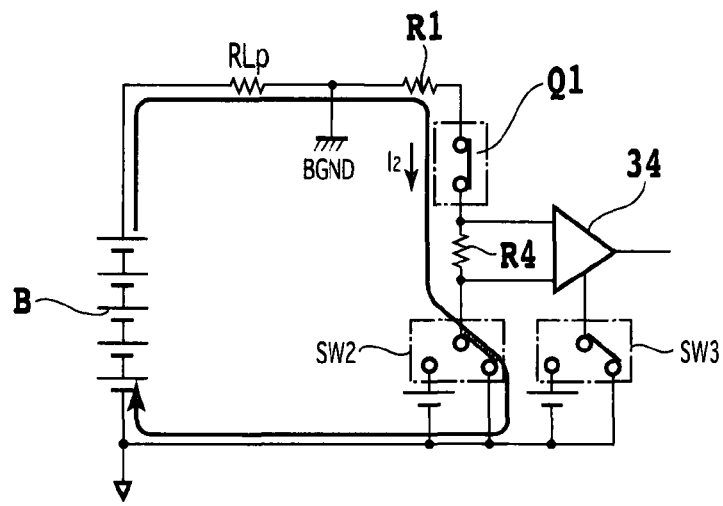
FIG. 11B is a diagram showing a flow of a leak current.

In step S88, a leak detection voltage is amplified by the amplifier 34 with a predetermined gain, for example a gain of one. A second high potential side input voltage Vin2 output from the A/D converter is obtained in step S90, and then the process returns. For example, the second high potential side input voltage Vin2 is obtained in a stable period T2. As shown in FIG. 11B, when a leak occurs on the high potential side, a leak current I2 flows from the positive electrode of the high-voltage battery B to the high potential side leak resistance RLp to the limiting resistance R1 to the FET Q1 to the detecting resistance R4 to the switch SW2 to the power source 36#2 (about 0 V) to the negative electrode of the high-voltage battery B.

In step S12 in FIG. 6, the input voltages Vin1 and Vin2, the first and second high potential side reference voltages Vref1 and Vref2, and the resistance values of the limiting resistance R1 and the detecting resistance R4 are substituted into Equation (3) to calculate the high potential side leak resistance RLp. Whether the high potential side leak resistance RLp is equal to or lower than a high potential side specified resistance is determined in step S14. When a positive determination is made, the process proceeds to step S18 to determine a high potential side leak. When a negative determination is made, the process proceeds to step S16 to determine a high potential side non-leak.

Figure 9:
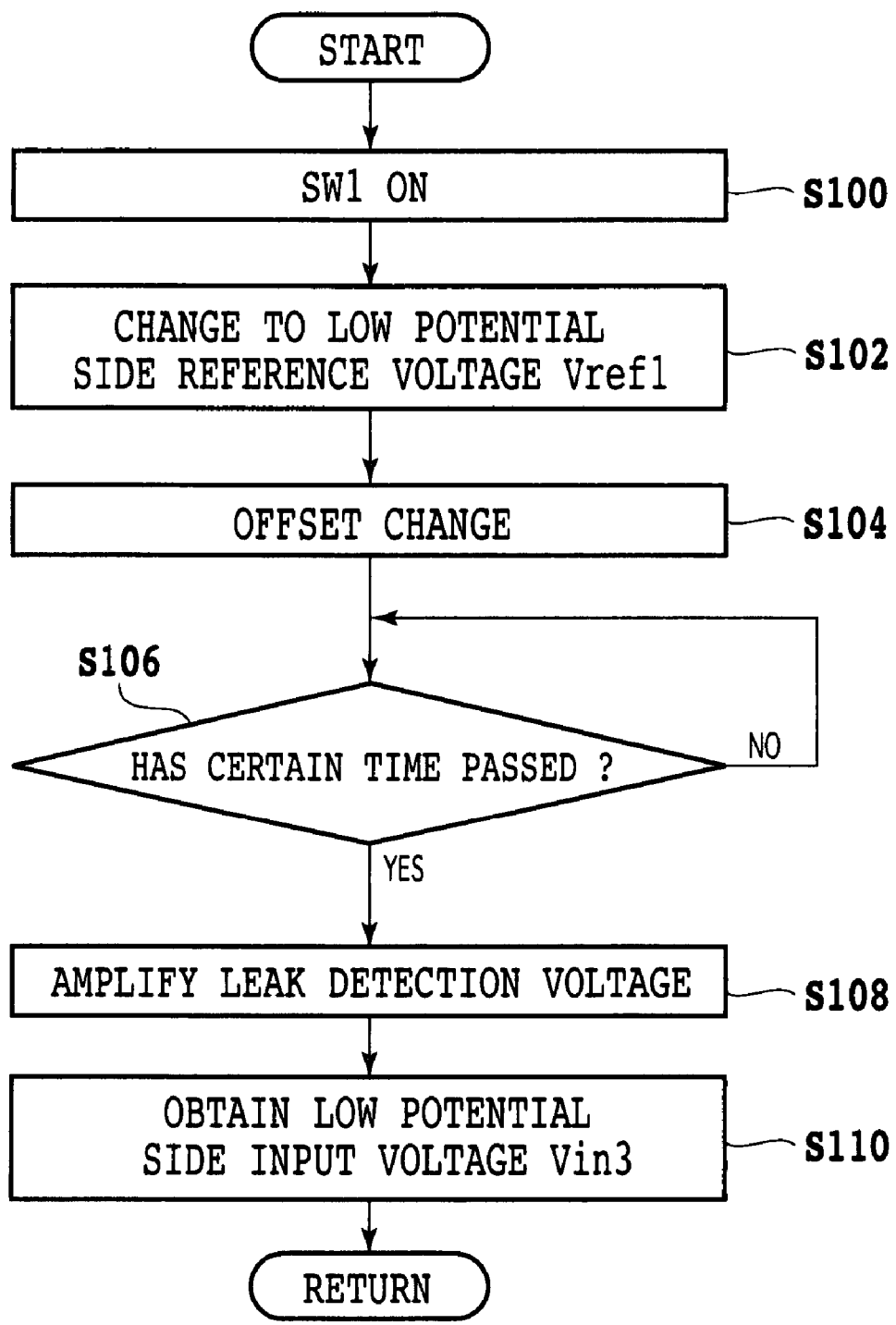
FIG. 9 is a flowchart representing the leak detecting method.
Figure 10:
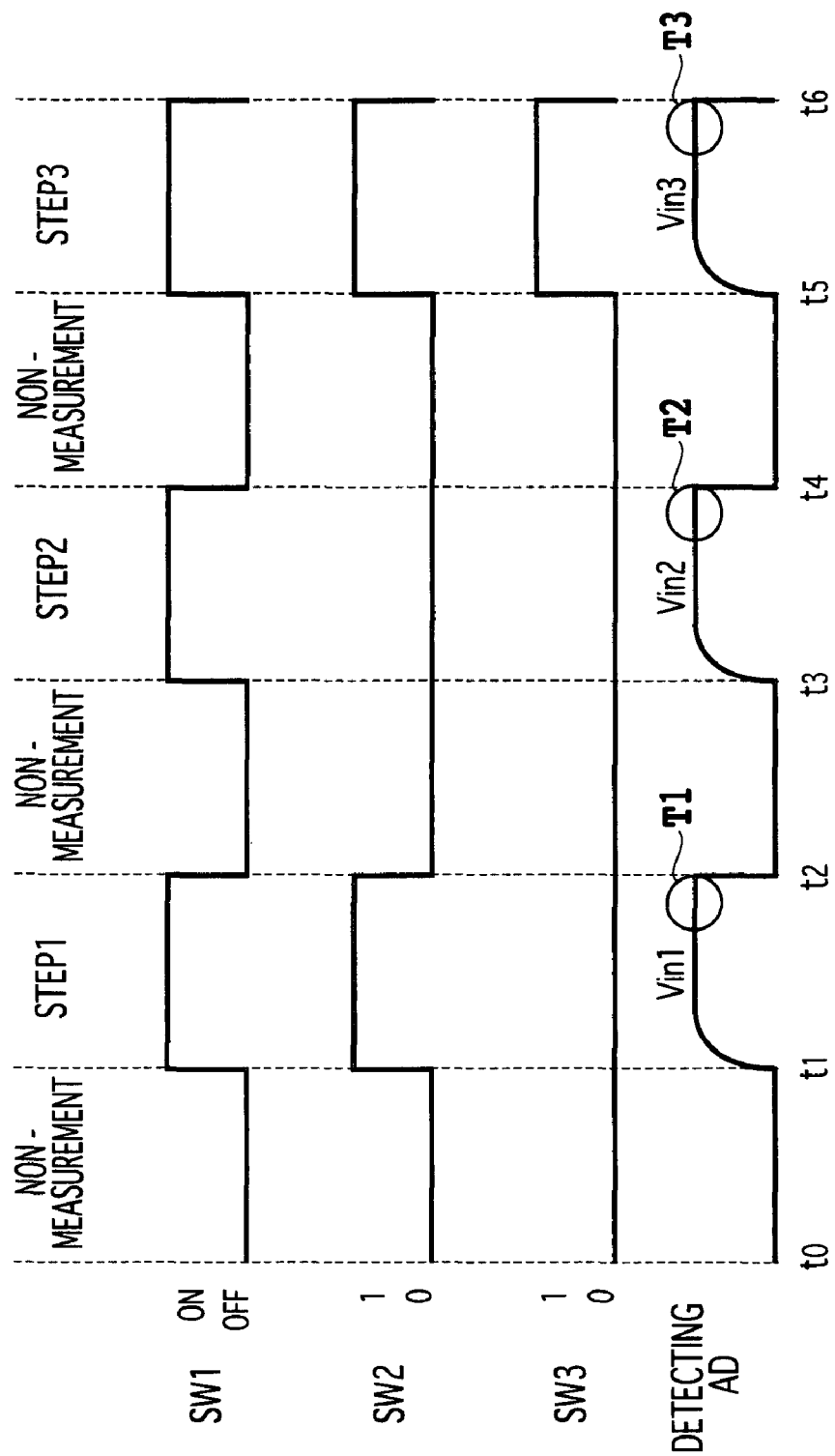
FIG. 10 is a time chart representing the leak detecting method.

A flow shown in FIG. 9 is performed in step S20 in FIG. 6. In step S100 in FIG. 9, the switch SW1 is turned on. In step S102, the switch SW2 in the variable direct-current power source 24 is controlled to change to the low potential side reference voltage Vref1, for example about 10 V. In step S104, the switch SW3 in the offset changing section 26 is controlled to make an offset change and output an offset voltage Vs (Vs>0). Whether a certain time after which the output of the FET Q1 is stabilized has passed or not is determined in step S106. When a positive determination is made, the process proceeds to step S108. When a negative determination is made, the process waits in step S106.

Figure 11C:
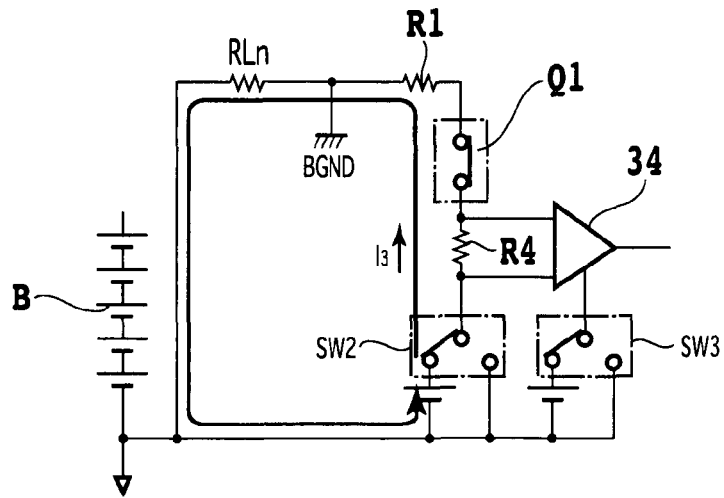
FIG. 11C is a diagram showing a flow of a leak current.

In step S108, a leak detection voltage is amplified by the amplifier 34 with a predetermined gain, for example a gain of one. A low potential side input voltage Vin3 output from the A/D converter is obtained in step S110, and then the process returns. For example, the low potential side input voltage Vin3 is obtained in a stable period T3. As shown in FIG. 11C, when a leak occurs on the low potential side, the diode D1 is on, and the FET Q1 is on. A leak current I3 flows from the positive electrode of the power source 36#1 to the detecting resistance R4 to the FET Q1 to the limiting resistance R1 to the body ground BGND to the low potential side leak resistance RLn to the negative electrode of the high-voltage battery B.

In step S22 in FIG. 6, the voltage Vin3, the low potential side reference voltage Vref1, the resistance values of the limiting resistance R1 and the detecting resistance R4, and the offset voltage Vs are substituted into Equation (5) to calculate the low potential side leak resistance RLn. Whether the low potential side leak resistance RLn is equal to or lower than a low potential side specified resistance is determined in step S24. When a positive determination is made, the process proceeds to step S26 to determine a low potential side leak. When a negative determination is made, the process proceeds to step S28 to determine a low potential side non-leak.

According to the present embodiment described above, the constant-voltage circuit that makes the voltage between the positive electrode of the variable direct-current power source 24 and the gate of the FET Q1 constant is provided. Even when the reference voltage Vref of the variable direct-current power source 24 differs, the voltage between the positive electrode of the variable direct-current power source 24 and the gate is constant, and the gate-to-source voltage Vgs is substantially constant. Therefore, the leakage current flowing from the gate to the source can be made constant. Thus, when a high potential side leak is detected while the power source of the variable direct-current power source 24 is changed, a difference between detected voltages or detected currents is obtained to cancel a measurement error due to the leakage current, so that leak detection accuracy is not degraded.

In the present embodiment, a field-effect transistor is used as a switch element. However, another switch element such as a bipolar transistor may be used. In addition, also when a low potential side leak is detected, a plurality of reference voltages Vref may be selected to calculate a low potential side leak resistance from a difference between voltages across the detecting resistance R4 or a difference between leak currents as in Equation (5). In addition, even when the reference voltage of the variable direct-current power source 24 is changed, the leakage current itself when a high potential side leak resistance or a low potential side leak resistance is measured can be suppressed by optimizing the voltage difference between the positive electrode of the variable direct-current power source 24 and the gate of the FET Q1 such that the leakage current is suppressed. Further, resistance when a high potential side leak resistance and a low potential side leak resistance are measured may be changed by providing a diode and a resistance in parallel with the limiting resistance R1 and the detecting resistance R4.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A leak detecting circuit comprising:
   a current path having one end connected to a conductor housing a device supplied with a direct-current voltage from a direct-current power source, and having another end connected to a negative electrode of said direct-current power source;
   said current path including a limiting resistance for limiting a current, a switch element having a first electrode, a second electrode, and a control electrode, conduction between said first electrode and said second electrode being controlled, a detecting resistance for detecting a current flowing through said current path, and a variable direct-current power source allowing a plurality of leak detecting reference voltages for detecting a leak to be selected, and having a negative electrode connected to the negative electrode of said direct-current power source;
   an amplifier for amplifying a voltage across said detecting resistance; and
   a constant-voltage circuit for making constant a potential difference between a voltage of said control electrode of said switch element and a voltage of a positive electrode of said variable direct-current power source;
   wherein a leak between said conductor and said direct-current power source is detected on a basis of the voltage across said detecting resistance, the voltage across said detecting resistance being amplified by said amplifier.

2. The leak detecting circuit according to claim 1, wherein said switch element is a field-effect transistor.

3. The leak detecting circuit according to claim 1, wherein when a high potential side leak between a positive electrode of said direct-current power source and said conductor is detected, a control signal is output to said variable direct-current power source so that a first leak detecting reference voltage and a second leak detecting reference voltage are output from said variable direct-current power source, a high potential side leak resistance between the positive electrode of said direct-current power source and said conductor is calculated on a basis of a difference between a first detected voltage across said detecting resistance at said first leak detecting reference voltage and a second detected voltage across said detecting resistance at said second leak detecting reference voltage, and said high potential side leak is detected.

4. The leak detecting circuit according to claim 2, wherein when a high potential side leak between a positive electrode of said direct-current power source and said conductor is detected, a control signal is output to said variable direct-current power source so that a first leak detecting reference voltage and a second leak detecting reference voltage are output from said variable direct-current power source, a high potential side leak resistance between the positive electrode of said direct-current power source and said conductor is calculated on a basis of a difference between a first detected voltage across said detecting resistance at said first leak detecting reference voltage and a second detected voltage across said detecting resistance at said second leak detecting reference voltage, and said high potential side leak is detected.

* * * * *